July 12, 1966
J. L. KOZIKOWSKI
3,260,860
PULSE SHAPER
Filed Oct. 9. 1963
2 Sheets-Sheet 1

INVENTOR.
JOSEPH L. KOZIKOWSKI
BY
Vincent L. Carney
ATTORNEY

July 12, 1966 J. L. KOZIKOWSKI 3,260,860

PULSE SHAPER

Filed Oct. 9. 1963

2 Sheets-Sheet 2

INVENTOR.

JOSEPH L. KOZIKOWSKI

BY Vincent L. Carney

ATTORNEY

United States Patent Office 3,260,860

Patented July 12, 1966

3,260,860

PULSE SHAPER

Joseph L. Kozikowski, Broomall, Pa., assignor to Burroughs Corporation, Detroit, Mich., a corporation of Michigan Filed Oct. 9, 1963, Ser. No. 314,984

11 Claims. (Cl. 307—88.5)

This invention relates to pulse shapers and more particularly, to pulse shapers for forming a rectilinear voltage pulse of controlled amplitude and width from an irregular pulse.

It is frequently desirable to shape voltage pulses. The waveforms of voltage pulses are often distorted by the reactance of the networks through which they are transmitted. However, rectilinear voltage pulses are necessary for the proper operation of many types of pulse networks, for example, magnetic memories.

Many pulse shapers are excessively complex and expensive. Frequently their repetition rate is too slow and their pulse width too great. Accordingly, it is an object of this invention to provide an improved pulse shaper.

It is a further object of this invention to provide a rapidly operating pulse shaper for providing output pulses having a controlled time width and a controlled amplitude.

It is a still further object of this invention to provide an inexpensive pulse shaper in which the time-width of the pulse depends only upon the delay of an externally connected delay line.

In accordance with the above objects a pulse shaper is provided in which an input pulse first triggers a transistor from its cut-off state to saturation and then a short time later drives the same transistor from saturation to cut-off. The transistor generates an output voltage having a fixed amplitude and having a time width that is determined by the period of time in which the transistor is in saturation. The input pulse first switches a tunnel diode, which is electrically connected to the emitter of the transistor, from its low-voltage state to its high-voltage state. This causes the transistor to go from cut-off to saturation. The input pulse is then passed through a delay line. After passing through the delay line it switches a second tunnel diode, which is electrically connected to the base of the transistor, from its low voltage state to its high voltage state, which, in turn, switches the transistor back from saturation to cut-off.

The invention and the above noted and other features thereof will be understood more clearly and fully from the following detailed description with reference to the accompanying drawings in which.

Figure 1:
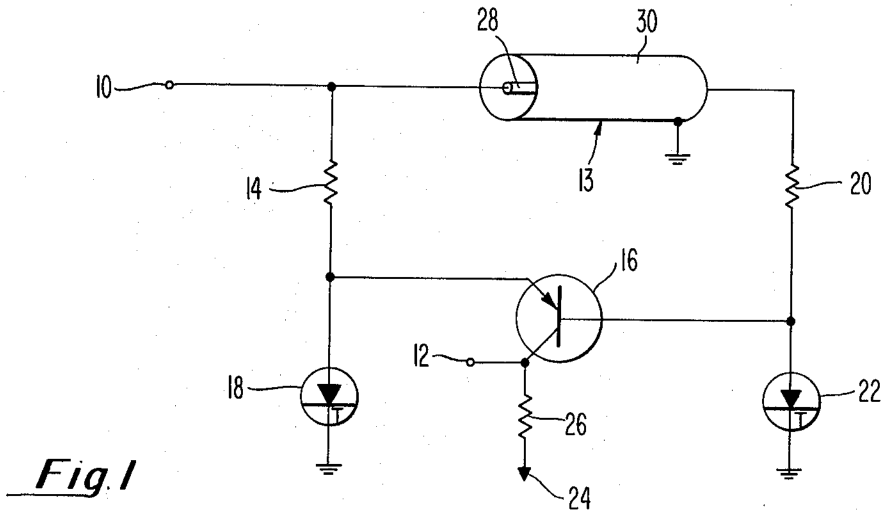
FIGURE 1 is a simplified schematic circuit diagram of an embodiment of the invention.

Referring now in particular to FIGURE 1, a schematic circuit diagram of a pulse shaper embodying the invention is shown, having an input terminal 10 electrically connected to the delay line 13 and to one end of resistor 14. The other end of resistor 14 is electrically connected to the emitter of PNP transistor 16 and to the anode of the tunnel diode 18; the cathode of tunnel diode 18 is grounded.

The delay line 13 is connected to one end of resistor 20. The other end of resistor 20 is electrically connected to the base of transistor 16 and to the anode of tunnel diode 22; the cathode of tunnel diode 22 is grounded. The collector of transistor 16 is electrically connected to a source of negative potential 24 through resistor 26 and to the output terminal 12. The delay line 13 comprises a coaxial cable having an inner conductor 28, which is electrically connected at one end to the input terminal 10 and at the other end to the resistor 20, and having an outer conductor 30, which is grounded.

While the pulse shaper of FIGURE 1 is in its quiescent state, the output terminal 12 will have a potential which is substantially negative due to the negative voltage source 24. This is because the transistor 16 is cut-off so that no current flows through the resistor 26, which separates the output terminal 12 from the negative voltage source 24. When a positive input pulse is applied to the input terminal 10, the tunnel diode 18 switches from its high-current low-voltage state to its high-voltage low-current state. The resulting positive voltage at the emitter of the transistor 16 forward biases this transistor, driving it into saturation. The resultant current flow through the transistor 16 causes a high voltage drop in the resistor 26, causing the voltage at the output terminal 12 to rise toward ground.

After the input voltage has passed through the delay line 13, it appears at the anode of tunnel diode 22, switching this tunnel diode from its low-voltage high-current state to its high-voltage low-current state. The resulting positive voltage which appears at the base of transistor 16 biases this transistor to cut-off, thereby arresting the flow of current through the resistor 26. Now, since there is no voltage drop in the resistor 26, the potential at the output terminal 12 again falls to a substantially negative value due to the negative voltage source 24. As the input voltage applied to the input terminal 10 passes the anodes of the tunnel diodes 18 and 22, they are each switched back from their high-voltage low-current states to their low-voltage high-current states, leaving the pulse shaper in its quiescent state.

Figure 2:
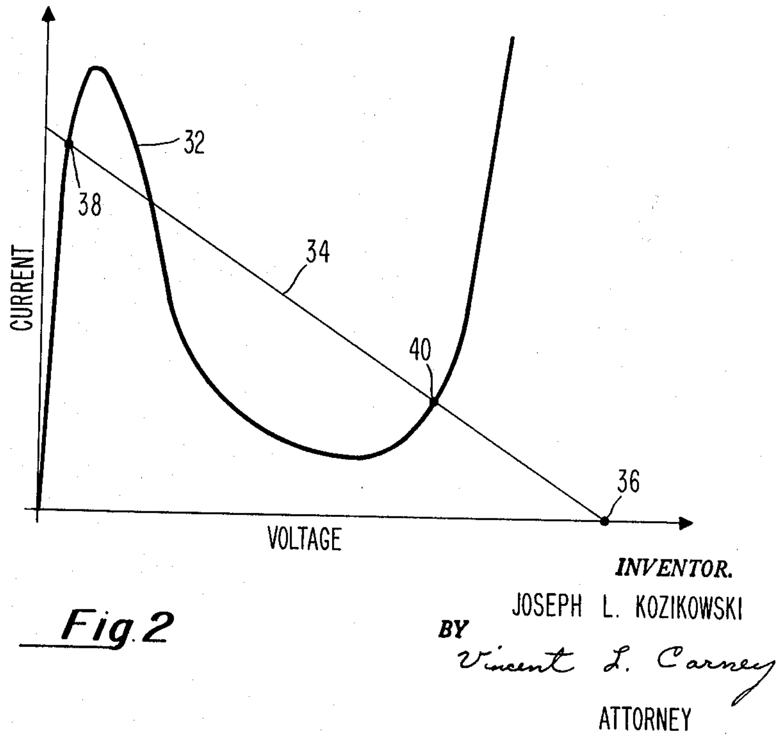
FIGURE 2 is a typical characteristic curve of a tunnel diode such as is used in an embodiment of the invention.

A graph showing the current-voltage characteristic curve of a typical tunnel diode is shown in FIGURE 2, having ordinates of current and abscissas of voltage. The tunnel diode characteristic curve 32 exhibits voltage-stable negative resistance. Because of this negative resistance characteristic, a tunnel diode that is in series with a resistance and a source of voltage may assume either of two conducting states for the same value of input voltage.

This is illustrated in the graph of FIGURE 2 by the "load" line 34, which line intersects the abscissa at the value of voltage 36 representative of the input voltage to terminal 10 in FIGURE 1 and which line has a slope that is numerically equal to the reciprocal of the resistance 14 in FIGURE 1. The two points 38 and 40 represent the values of current and voltage which may exist in both the tunnel diode and the series resistance with the value of the voltage from the origin to the point being equal to the voltage falling across the tunnel diode and with the value of voltage to the point 36 being equal to the voltage across the resistor. The two voltages together equal the voltage input to the circuit. The point 38 is called the high-current low-voltage point and the point 40 is called the high-voltage low-current point.

Graphically, an increasing input voltage may be visualized as a "load" line which retains its slope but moves upward so as to intersect the abscissa and ordinate at larger and larger values.

It can be seen that, as the input voltage to the series combination of a resistor and a tunnel diode is increased, a value of input voltage will be reached for which the current-voltage relationship of the tunnel diode and of the resistor may be satisfied only by a point on the high-voltage low-current portion of the characteristic curve 32. When this value of voltage is reached, the tunnel diode will switch from the high-current low-voltage state to the high-voltage low-current state. Similarly, as the input voltage decreases the tunnel diode will switch back from its high-voltage low-current state to its high-current low-voltage state. This switching is very rapid.

The rapid switching of the tunnel diode 18 in FIGURE 1 drives the transistor 16 into saturation very quickly causing the output voltage pulse at terminal 12 to have a very short rise time. The rapid switching of the tunnel diode 22 from its low-voltage state to its high-voltage state biases the transistor 16 to cut-off very quickly providing a sharp termination of the output voltage pulse at terminal 12. In this way the output voltage from the pulse shaper maintains a constant time-width and good rectilinearity.

Figure 3:
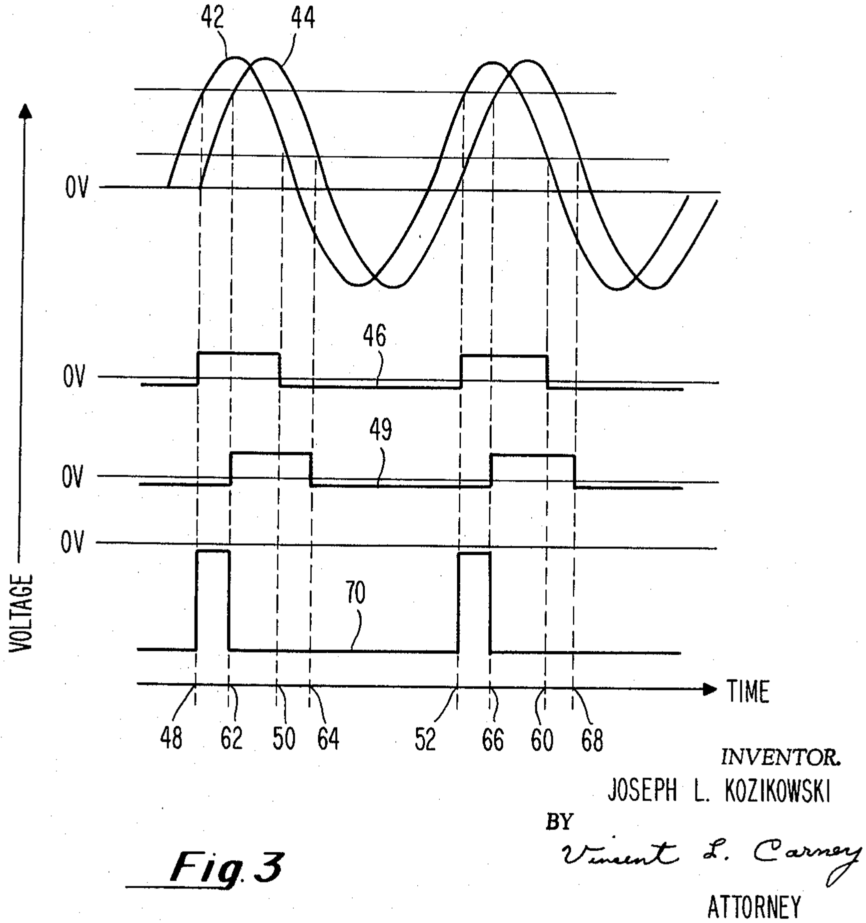
FIGURE 3 is a graph showing several voltage waveforms each of which appear at a different point in the circuit of FIGURE 1; and, FIGURE 4 is a more detailed schematic circuit diagram of an embodiment of the invention.

In FIGURE 3, a graph is provided having a plurality of curves each representing a voltage waveform that appears at a different point in the circuit of FIGURE 1. The curves have common abscissas of time and individual ordinates of voltage. The curve 42 represents a sinusoidal input voltage which may be applied to the input 10 so as to appear at the anode of tunnel diode 18. The curve 44 represents the sinusoidal voltage as it appears at the anode of tunnel diode 22 a period of time later as determined by the delay line 13. The curve 46 represents the voltage waveform at the anode of tunnel diode 18 showing a positive-going voltage pulse between the times indicated on the abscissa by 48 and 50 caused by the first cycle of the input sinusoidal waveform 42 and showing a second positive-going pulse between the times indicated on the abscissa by 52 and 60 caused by the second cycle of the sinusoidal input voltage 44. The curve 49 represents the voltage waveform appearing at the anode of tunnel diode 22 having a first positive-going pulse between times 62 and 64 caused by the first cycle of the sinusoidal input voltage and having a second positive-going voltage pulse between times 66 and 68 caused by the second cycle of the sinusoidal input voltage. The curve 70 represents the voltage waveform appearing at output terminal 12 and having a first positive-going voltage pulse between the times 48 and 62 caused by the first cycle of the sinusoidal input voltage and having a second output voltage pulse between the times 52 and 66 caused by the second cycle of the sinusoidally varying input voltage.

At the time 48 the input voltage 42 has reached a high enough value to switch the tunnel diode 18 from its high-current low-voltage state to its high-voltage low-current state. At the time 50 the input voltage 42 has passed through its peak and has fallen to such a low value of voltage that the tunnel diode 18 was switched back from its high-voltage low-current state to its high-current low-voltage state. This process is repeated between the times 52 and 60. When the tunnel diode 18 switches from its high-current low-voltage state to its high-voltage low-current state at the times 48 and 52, the transistor 16 is driven into saturation so as to cause the voltage at the output terminal 12 to rise from a substantially negative potential determined by the source 24 towards a value close to ground as shown in the curve 70.

At the time 62 the voltage 44 has risen to such a value as to switch the tunnel diode 22 from its high-current low-voltage state to its high-voltage low-current state. At the time 64 the voltage 44 has fallen to such a low value that the tunnel diode 22 switches back from its high-voltage low-current state to its high-current low-voltage state. This process is repeated between times 66 and 68. When the tunnel diode 22 switches from its high-current low-voltage state to its high-voltage low-current state the transistor 16 is biased to cut-off causing the voltage at terminal 12 to fall back to a substantially negative potential determined by the negative voltage source 24. This results in the two output voltages of constant amplitude and width, shown by curve 70 between the times 48 and 62 and 52 and 66.

Some obvious modifications of the circuit of FIGURE 1 arises from the nature of transistors. For example, if the base and emitter connections of the transistor 16 are reversed or if a NPN transistor is used instead of the PNP transistor, the output pulse will be generated on the falling portion of the input pulse; but, if both of the above changes are made, the circuit will operate as before, generating the output pulse on the rising portion of the input pulse. Negative-going pulse operation may also be obtained by reversing the tunnel diodes 18 and 22 so that their cathodes are electrically connected to the resistors 14 and 20 respectively, and so that their anodes are grounded. Moreover, although sinusoidal input voltages were used in the above explanation, the pulse shaper will operate with many other types of input voltages.

Figure 4:
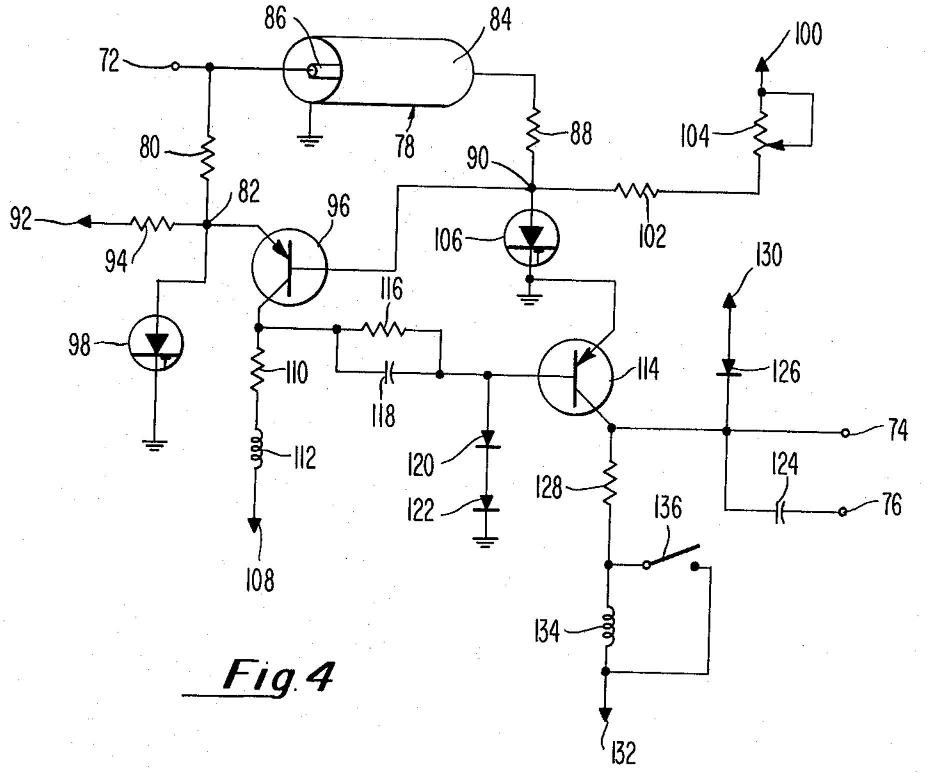

Referring now in particular to FIGURE 4, a more detailed schematic circuit diagram is shown having a pulse shaper input terminal 72, a D.C. output terminal 74 and an A.C. output terminal 76. The input terminal 72 is electrically connected to the delay line 78 and to one end of the 220 ohm resistor 80; the other end of the resistor 80 is electrically connected to terminal 82. The delay line 78 is comprised of the grounded outer conductor 84 and an inner conductor 86 which is electrically connected at one end to the input terminal 72 and at the other end to one end of 220 ohm resistor 88; the other end of resistor 88 is connected to the terminal 90.

Terminal 82 is electrically connected to a source of positive 6 volts 92 through the 390 ohm resistor 94, to the emitter of PNP transistor 96, which is of the type 2N769 manufactured by Philco Corporation, and to the anode of the tunnel diode 98, which is the type 1N3129 manufactured by RCA; the cathode of the tunnel diode 98 is grounded. Terminal 90 is electrically connected to the source of a positive 6 volts 100 through the series combination of a 330 ohm resistor 102 and a 250 ohm potentiometer 104, to the base of transistor 96, and to the anode of a tunnel diode 106 which is the type 1N3129 manufactured by RCA; the cathode of the tunnel diode 106 is grounded.

The collector of the transistor 96 is electrically connected to a source of negative 6 volts 108 through the series combination of a 470 ohm resistor 110 and a 4.7 microhenry inductor 112 and to the base of the PNP transistor 114, which is of the type 2N769 manufactured by Philco Corporation, through the parallel combination of a three K ohm (kilo-ohm) resistor 116 and a 36 pf. (picofarad) capacitor 118. The base of the transistor 114 is also connected to the anode of the 1N914 diode 120. The cathode of the diode 120 is electrically connected to the anode of a 1N510 diode 22 and the cathode of diode 122 is grounded.

The emitter of the transistor 114 is grounded. The collector of transistor 114 is electrically connected to the A.C. output terminal 76 through the 0.1 mf. (microfarad) capacitor 124, to the D.C. output terminal 74, to the cathode of a 1N555 diode 126, and to one end of the 150 ohm resistor 128. The anode of the diode 126 is electrically connected to a source of a negative 6 volts 130; the other end of resistor 128 is electrically connected to a source of negative 15 volts 132 through the 100 microhenry inductor 134 and to the switch 136. The other end of the switch 136 is electrically connected to the source of negative 15 volts 132.

A positive input pulse to the input terminal 72 triggers the tunnel diode 98 from its high-current low-voltage state to its high-voltage low-current state when it reaches a predetermined value as explained in connection with FIGURE 1. The positive voltage 92 enables switching to take place at a lower input voltage. After the positive input pulse has passed through the delay line 78, it also switches the tunnel diode 106 from its high-current low-voltage state to its high-voltage low-current state. The positive voltage source 100 biases this tunnel diode so as to provide switching at lower input voltages.

The potentiometer 104 provides a bias adjustment which may be used to determine the voltage necessary to switch the tunnel diode 106. As the resistance of the potentiometer 104 is increased, the positive bias at terminal 90 is decreased so as to require a larger switching voltage. This will increase the width of the output pulse since the input voltage must increase to a larger value before switching the tunnel diode 106 from its high-current low-voltage state to its high-voltage low-current state.

When the tunnel diode 98 is switched to its high-voltage state by the input pulse, the transistor 96 is saturated causing its collector voltage to rise from a substantially negative potential due to the negative source 108 toward a potential close to ground; when the tunnel diode 106 is switched to its high-voltage state, the transistor 96 is biased to cut-off causing its collector voltage to fall back from its less negative potential to a substantially negative potential determined by the source 108. The positive-going voltage pulse generated at the collector of the transistor 96 is conducted to the base of the transistor 114 through the parallel combination of resistor 116 and capacitor 118. The two series-connected clamping diodes 120 and 122 limit its amplitude.

The transistor 114 inverts this pulse and increases the slope of its leading and trailing edges because of the clamping action of the diode 126 and the negative supply voltage 130. When the switch 136 is open, the output is taken from output terminal 76 and has a zero average D.C. level. When the switch 136 is closed, the output is taken from terminal 74 in the form of pulses that ride on the ground level.

It can be seen that the pulse shaper of this invention is reliable and inexpensive. It provides rectilinear output pulses at a high frequency and the amplitude of these pulses is not affected by the shape of the input pulses. The pulse width of the output pulses depends primarily on the delay of an externally connected delay line and the setting of a fine width control 104, and is not significantly affected by either the width or amplitude of the input pulses.

Obviously many modifications and variations of the present invention are possible in the light of the above teachings. It is therefore to be understood that within the scope of the appended claims the invention may be practiced otherwise than as specifically described.

What is claimed is:

1. The combination comprising:

current-valve means, having first and second control terminals and an output terminal, for providing an output voltage only while receiving an input voltage on said first control terminal and no input voltage on said second control terminal;

delay means having a first terminal and a second terminal electrically connected to said first and second control terminals, respectively, whereby a voltage applied to said first control terminal is conducted to said second control terminal after a predetermined period of time;

first and second negative resistance means coupled, respectively, between the first and second terminals of said delay means and the output terminal of said current-valve means; and an input terminal electrically connected to said first control terminal for applying input pulses thereto, whereby an output pulse is provided by said current-valve means at said output terminal which pulse has a time width approximately equal to the delay time of said delay means.

2. The combination comprising:

current-valve means, having a first control terminal and a second control terminal and an output terminal, for providing a voltage to said output terminal while receiving a voltage on said first control element and not on said second control element;

delay means, having an input terminal and an output terminal, for delaying a voltage pulse that is applied to said input terminal of said delay means for a predetermined time before applying it to said output terminal of said delay means;

first switch means, electrically connected to said input terminal of said delay means and to said first control terminal of said current-valve means, for providing a voltage to said first control terminal while receiving a voltage on said input terminal of said delay line of a predetermined magnitude and polarity, whereby said current-valve means will provide a voltage to said output terminal of said current-valve means when a voltage is applied to said input terminal of said delay means having said predetermined magnitude and polarity;

second switch means, electrically connected to said output terminal of said delay means and to said second control element of said current-valve means, for applying a voltage to said second control terminal of said current-valve means while receiving a voltage from said output terminal of said delay means having a predetermined magnitude and polarity, whereby the output voltage at said output terminal of said current-valve means is terminated.

3. The combination according to claim 2 in which said first and second switch means each comprise a tunnel diode.

4. The combination according to claim 3 in which said current-valve means comprises a transistor.

5. A pulse shaping circuit comprising:

a first negative-resistance element connected in series with a first impedance element;

a second negative-resistance element connected in series with a second impedance element;

an electrical delay line having its input electrically connected to the serially connected circuit of said first elements and having its output connected to the serially connected circuit of said second elements;

input terminal means coupled to the input of said delay line for receiving input signals;

switching means, electrically connected to said first and second negative-resistance elements, for delivering an output signal which is a function of the instantaneous potential developed across said first and second negative-resistance elements.

6. A pulse shaping circuit according to claim 5 in which said first and second negative-resistance elements comprise tunnel diodes.

7. A pulse shaping circuit according to claim 6 in which said switch means comprises a transistor having three electrodes, the first electrode being connected to the input of said delay line, the second electrode being connected to the output of said delay line, and the output of said circuit being developed between the third electrode and ground.

8. A pulse shaper comprising:

a pulse-shaper input terminal for receiving voltage pulses;

a delay line having a delay-line input terminal electrically connected to said pulse-shaper input terminal and having a delay-line output terminal;

a first resistor having an input terminal electrically connected to said pulse-shaper input terminal and having a first-resistor output terminal;

a second resistor having an input terminal electrically connected to said delay line output terminal and having a second-resistor output terminal;

a first tunnel diode having one electrode connected to said first-resistor output terminal and having the other electrode grounded;

a second tunnel diode having one electrode electrically connected to said second-resistor output terminal and having the other electrode grounded;

a transistor having one electrode electrically connected to said first-resistor output terminal, having a second electrode electrically connected to said second-resistor output terminal, and having a third electrode;

a pulse-shaper output terminal electrically connected to said third electrode of said transistor; and a third resistor being electrically connected to one end of said third electrode of said transistor and being connected to a source of electrical potential at its other end.

9. A pulse shaper according to claim 8 in which said first electrodes of said first and second tunnel diodes comprise the anodes of said first and second tunnel diodes and in which said second electrodes of said first and second tunnel diodes comprise the cathodes of said first and second tunnel diodes.

10. A pulse shaper according to claim 9 in which said first electrode of said transistor is an emitter electrode, said second electrode of said transistor is a base electrode, said third electrode of said transistor is a collector electrode, said transistor is a PNP transistor and said source of electrical potential has a negative polarity.

11. A circuit for providing positive, rectilinear, output-voltage pulses to a first output terminal and to a second output terminal upon receiving a positive voltage pulse on a circuit input terminal comprising:

a delay line having a delay-line input terminal electrically connected to said circuit input terminal and having a delay line output terminal;

a first resistor having a resistor input terminal electrically connected to said circuit input terminal and having a first resistor output terminal;

a second resistor electrically connected at one end to said first resistor output terminal and adapted to be connected to a source of positive potential at its other end;

a first tunnel diode having its anode electrically connected to said first resistor output terminal and having its cathode grounded;

a third resistor having a third resistor input terminal electrically connected to said delay line output terminal and having a third resistor output terminal;

a second tunnel diode having its anode electrically connected to said third resistor output terminal and having its cathode grounded;

a potentiometer having a potentiometer input terminal electrically connected to said third resistor output terminal and having the potentiometer output terminal adapted to be connected to a source of positive potential;

a first PNP transistor having its emitter electrically connected to said first resistor output terminal, having its base electrically connected to said third resistor output terminal and having a collector;

a fourth resistor having a fourth resistor input terminal electrically connected to the collector of said first PNP transistor and having a fourth resistor output terminal;

a first inductor having a first inductor input terminal electrically connected to said fourth resistor output terminal and having an inductor output terminal adapted to be connected to a source of negative potential;

a fifth resistor having a fifth resistor input terminal electrically connected to said collector of said first PNP transistor and having a fifth resistor output terminal;

a first capacitor having one plate electrically connected to said collector of said first PNP transistor and having its other plate electrically connected to said fifth resistor output terminal;

a diode having its anode electrically connected to said fifth resistor output teminal and having its cathode grounded;

a second PNP transistor having its emitter grounded, its base electrically connected to said fifth resistor output terminal and having a collector;

a sixth resistor having a sixth resistor input terminal electrically connected to said collector of said second PNP transistor and having a sixth resistor output terminal;

a second inductor electrically connected at one end to said sixth resistor output terminal and adapted to be connected to a source of negative potential at its other end;

a switch having its input and output terminals electrically connected in parallel with said second inductor;

a second diode having its cathode electrically connected to said collector of said second PNP transistor and having its anode adapted to be connected to a source of negative potential;

said first circuit output terminal being electrically connected to said cathode of said second diode; and a third capacitor having one plate electrically connected to the cathode of said second diode and having its other plate electrically connected to said second circuit output terminal.

References Cited by the Examiner

UNITED STATES PATENTS

| | | | |
|---|---|---|---|
| 2,966,597 | 12/1960 | Bonn et al. | 307—88.5 |
| 3,089,040 | 5/1963 | Hovey | 307—88.5 |

ARTHUR GAUSS, *Primary Examiner.*

J. HEYMAN, S. D. MILLER, *Assistant Examiners.*